US005789966A

United States Patent [19]
Béchade

[11] Patent Number: 5,789,966
[45] Date of Patent: Aug. 4, 1998

[54] DISTRIBUTED MULTIPLEXER

[75] Inventor: Roland Albert Béchade, South Burlington, Vt.

[73] Assignee: International Business Machines Corporation, Armonk, N.Y.

[21] Appl. No.: 715,654

[22] Filed: Sep. 18, 1996

[51] Int. Cl.$^6$ .................................................. H03K 17/16
[52] U.S. Cl. ............................................ 327/407; 327/408
[58] Field of Search .................................. 327/407, 408, 327/409, 410, 411, 412, 413, 99

[56] References Cited

U.S. PATENT DOCUMENTS

| | | | |
|---|---|---|---|
| 3,965,459 | 6/1976 | Spencer et al. | 327/408 |
| 4,010,385 | 3/1977 | Krol | 327/408 |
| 4,390,988 | 6/1983 | Best et al. | 327/411 |
| 4,446,390 | 5/1984 | Alaspa | 327/391 |
| 4,910,466 | 3/1990 | Kiuchi et al. | 327/407 |
| 4,985,703 | 1/1991 | Kaneyama | 341/141 |
| 5,012,126 | 4/1991 | Feldbaumer et al. | 327/410 |
| 5,162,666 | 11/1992 | Tran | 327/408 |
| 5,376,829 | 12/1994 | Rogers et al. | 327/408 |
| 5,625,303 | 4/1997 | Jamshidi | 327/408 |
| 5,654,660 | 8/1997 | Orgill et al. | 327/407 |

FOREIGN PATENT DOCUMENTS

| | | | |
|---|---|---|---|
| 54-104767 | 8/1979 | Japan | 327/407 |
| 59-147534 | 8/1984 | Japan | H03K 17/00 |
| 62-71346 | 4/1987 | Japan | 327/407 |
| 5-41644 | 2/1993 | Japan | 327/407 |

OTHER PUBLICATIONS

IBM Technical Disclosure Bulletin vol. 36 No. 07 Jul. 1993 "Fast-Switch and Sense Array Data Circuit".

Primary Examiner—Timothy P. Callahan
Assistant Examiner—Eunja Shin
Attorney, Agent, or Firm—Whitham, Curtis & Whitham; Eugene I. Shkurko

[57] ABSTRACT

Signal propagation time through a transmission gate array or multiplexer is significantly reduced and output signal transition time is halved by detecting non-selection of a section of the multiplexer and activating an output circuit, preferably in the form of a logic gate, to respond to a signal passed through a selected section of the transmission gate array or multiplexer. Specifically, upon non-selection of a section, an appropriate logic-valued signal at a reference voltage is propagated on an internal node of the multiplexer to the input of the output circuit to precondition or activate the output circuit. Since this signal is strongly tied to the reference voltage, the response of the output circuit is improved in both response time and transition time. Further, capacitance of internal nodes of the multiplexer is insulated or isolated from the inputs to the multiplexer, avoiding trade-offs between circuit performance and wiring congestion.

10 Claims, 3 Drawing Sheets

DISTRIBUTED MULTIPLEXER

BACKGROUND OF THE INVENTION

1. Field of the Invention

The present invention generally relates to digital logic and switching circuits and, more particularly, transmission gate arrays such as multiplexers.

2. Description of the Prior Art

Digital logic circuits performing Boolean combinations of logic-valued input signal voltages are well-known and designs implementing numerous sophisticated technologies have been developed to provide an extremely high level of performance. The same is true of other types of digital circuits in the same or compatible technologies such as inverters, level shifters or transmission gates which do not, in a strict sense, perform combinatorial logic but, nevertheless, provide logic values, voltages and controllable connectivity necessary to support the function of the overall design.

In particular, arrays of transmission gates, more commonly referred to as multiplexers in view of their most common application, are particularly important to several types of logic circuit designs and functions. Specifically, a transmission gate is basically a voltage controlled switch to pass or block a signal between its input and output. One or more transmission gates may have a common output to allow selective connection of any one of a plurality of signals to a particular node of a logic circuit. For example, a multiplexer is typically used (on chip) to connect an alternate address to a memory array in synchronism with an enable signal to permit performance of more than one memory operation within a single memory cycle. As another example, multiplexers are often used for certain types of data manipulation to facilitate some particular operations or algorithms in processors capable of mathematical computations. A common application is for bit shifting which may permit a highly efficient algorithm to be employed.

Bit shifting is particularly important in programmed data processors which must, as is well-recognized, process a large number of binary digits to prevent round-off processes causing large errors in a numerical result when a process is repeated or a variable operated upon numerous times. Leading zero detection and counting and extraction of a least significant bit (LSB) and/or a so-called guard bit are also an important function necessary to efficient algorithms for computations executable by such mathematical processors. To provide bit shifting, it is accordingly clearly seen that a multiplexer may be provided to provide connectivity to a node for signals which may be a significant number of bits apart on a chip. The separation of points between which selective connection must be made, of course, must be physically accommodated on the chip and different methods of doing so imply trade-offs regarding both performance and integration density.

For example, to perform the function of leading zero counting, sixteen-bit segments of data are multiplexed four bits at a time into four outputs. One solution is to bring all sixteen possible inputs to an integrated four-way multiplexer. However, this approach consumes a large amount of chip space for the routing of conductors to the integrated multiplexer. As an alternative to reduce overall wiring length and chip area, the multiplexer can be split into several parts each located more proximate to the inputs it is to receive and using a single wire to connect the outputs of the respective parts. Such a multiplexer is referred to as a distributed multiplexer because of the spatial separation of the respective portions thereof. However, the reduction of wiring space may not be as great as might be anticipated since control signals must still be brought to each of the respective parts of the distributed multiplexer. Moreover, performance is compromised principally due to the capacitance of the connection of the wiring connecting the respective outputs of the parts of the distributed multiplexer. The large internal capacitance thus caused slows propagation time of a signal through the multiplexer circuit. Further, in many computational algorithms, the multiplexer will often be found to be unavoidably in a critical path and the overall function of the logic device must be slowed to correctly carry out a desired function. Response may further be slowed, although generally to a lesser degree, if the length of control signal connections to the parts of the distributed multiplexer causes any significant increase in capacitance which may increase signal transient time and result in signals having a temporary ambiguity as to the logic state represented as well as much increased power dissipation. The trade-off in performance and/or chip space between integrated multiplexers and distributed multiplexers has been unavoidable at the present state of the art because of the physical impossibility of decreasing the length of connections between points in the plane of the chip. For example, rearranging the order of bits at any point in the circuit requires virtually the same space and length of conductors and significant improvement has, therefore, not been possible by changes in device or wiring layout.

SUMMARY OF THE INVENTION

It is therefore an object of the present invention to provide a distributed multiplexer or transmission gate array which maintains a fast circuit response time.

It is another object of the invention to provide a circuit and technique of reducing wiring congestion while avoiding trade-offs against circuit performance.

It is a further object of the invention to provide a technique of effectively reducing internal capacitance of a distributed logic circuit such as a multiplexer or transmission gate array.

In order to accomplish these and other objects of the invention, a multiplexer circuit having a plurality of sections and an output circuit is provided, comprising a detector for detecting non-selection of a section of said multiplexer, and an arrangement responsive to the detector for propagating a logic-value signal to an input of said output circuit.

In accordance with another aspect of the invention, a method of operating a transmission gate array divided into plural selectable sections is provided including the steps of detecting non-selection of a section of the transmission gate array, activating an output circuit in response to such detection, and propagating a signal from a selected section of said transmission gate array through the output circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
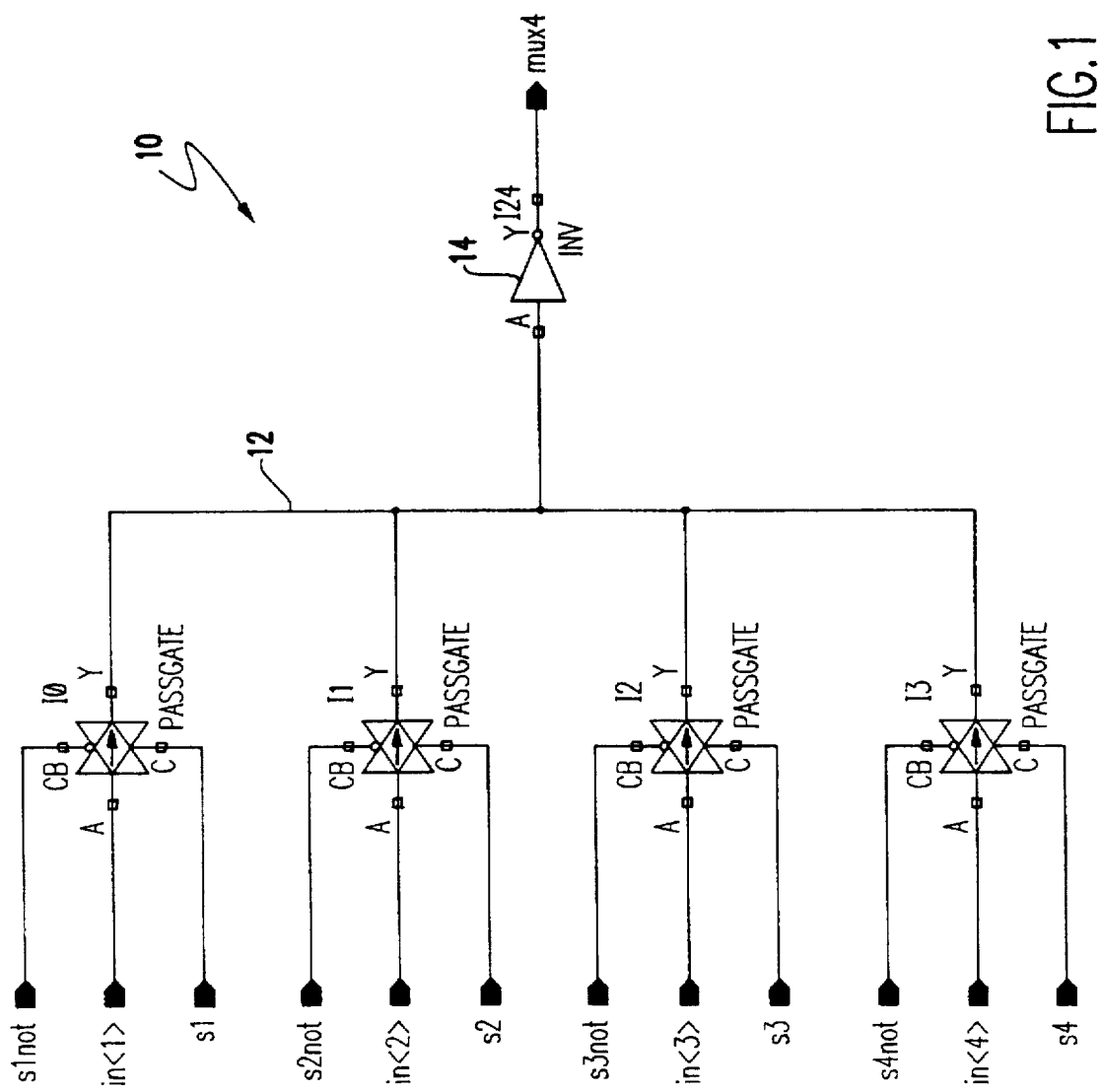
FIG. 1 is a schematic diagram of a four-way multiplexer.

Referring now to the drawings, and more particularly to FIG. 1, there is shown a schematic depiction of a four-way multiplexer circuit 10. It is to be understood that no portion of the depiction of FIG. 1 is admitted to be prior art as to the present invention. The depiction of FIG. 1 does not include the salient features of the invention and is provided to facilitate an understanding of the nature and applicability of the invention by comparison with the multiplexers of FIGS. 2 and 3 which do include the salient features of the invention.

Further, due to the schematic nature of the depiction, FIG. 1 is generic to either an integrated or distributed multiplexer; the difference between integrated and distributed multiplexers being the physical proximity on a chip or wafer of the transmission gates I0, I1, I2, I3 arrayed therein. It can thus be appreciated in the above example, that four of the multiplexer circuits 10 depicted in FIG. 1 would be required to selectively switch bits of each of four four-bit groups comprising a sixteen bit segment to respective ones of four outputs. In such a case, the corresponding transmission gates in each of the four respective multiplexer circuits (or, simply, multiplexers) 10 would be arrayed in layout in some interleaved manner which would thus cause each multiplexer to be considered as being "distributed". Such spatial separation would necessarily require increase of length of connection 12 and increase the capacitive load presented to the output of each transmission gate.

Figure 2:
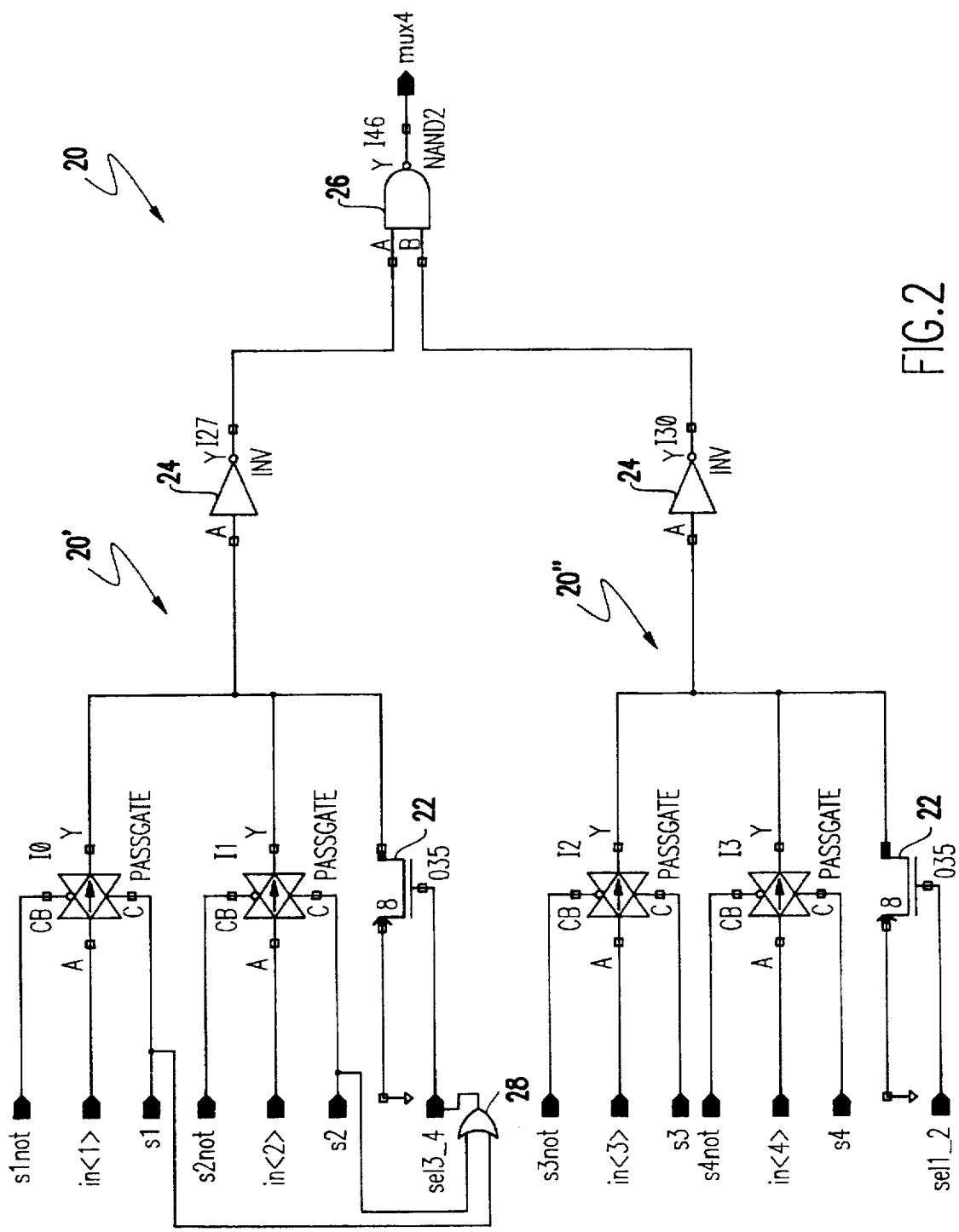
FIG. 2 is a schematic diagram of a distributed four-way multiplexer in accordance with a preferred form of the invention.
Figure 3:
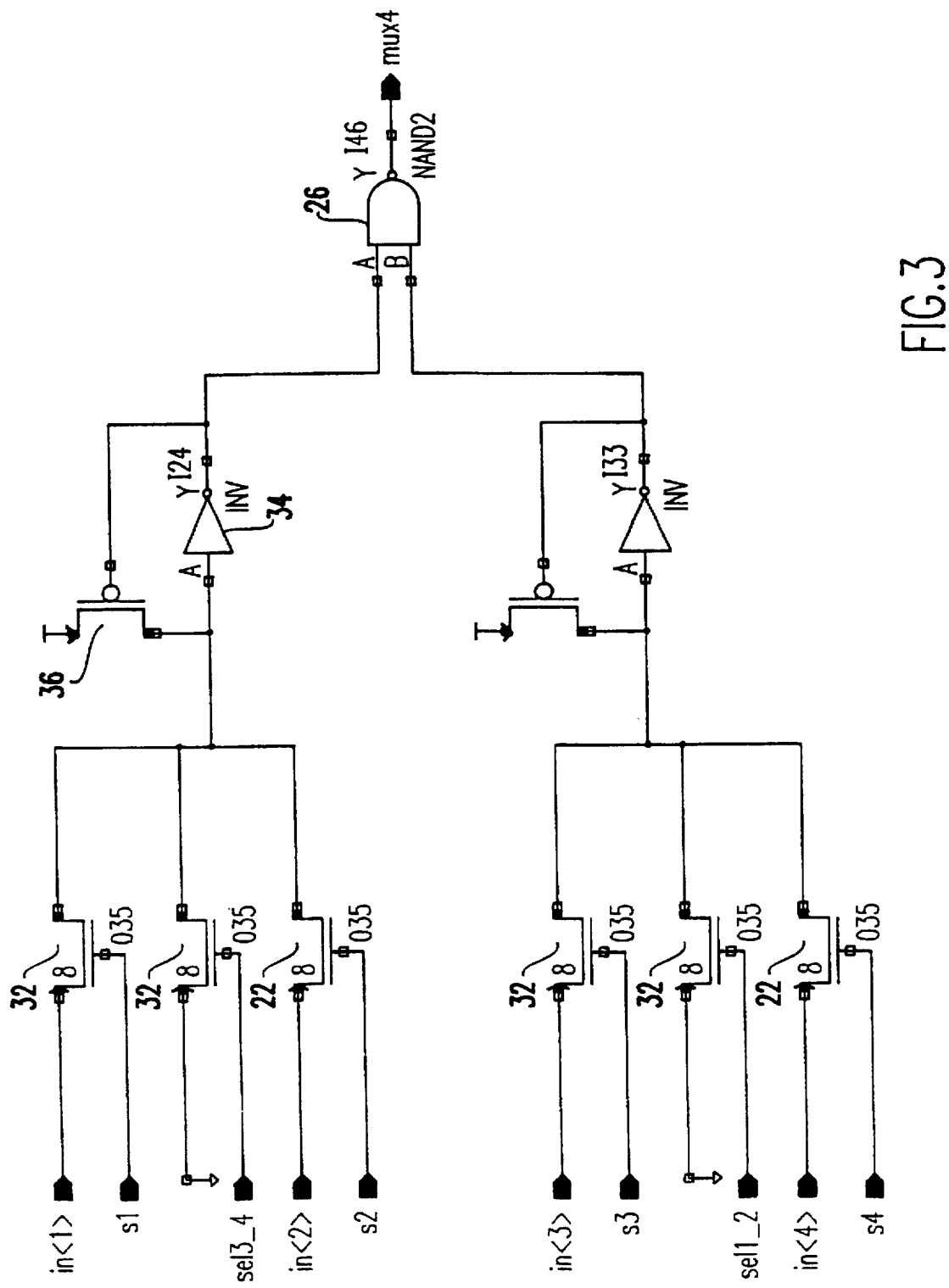
FIG. 3 is a schematic diagram of a distributed four-way multiplexer in accordance with a variant implementation of the invention.

It should be noted in this regard that the multiplexer of FIG. 1 and the multiplexers employing the invention, as illustrated in FIGS. 2 and 3, are illustrated as being embodied using field effect transistor technology, and preferably CMOS technology, as illustrated in FIGS. 1 and 2. While the invention is particularly advantageous when used in circuits embodied in field effect transistors, it is to be understood that the principles of the invention are also applicable to circuits embodied in other technologies such as those using bipolar transistors.

Regardless of the technology used to implement the multiplexer, transmission gates I0–I3 are not ideal conductors and will present some small series resistance, at best. In CMOS, the "on" resistance will generally be in the order of several hundred ohms, depending on channel dimensions of each of the p and n complementary transistors connected in parallel therein. (True and complement control inputs must therefore be provided to properly control the parallel transistors of opposite conductivity types.) Since a non-negligible finite series resistance is connected in series with a capacitive load presented by connector 12, it can readily be appreciated that increase of capacitance of connector 12 will greatly reduce the speed of signal propagation.

For example, if transmission gates I0–I3 are adjacent on a chip, as in an integrated multiplexer, the connection to inverter 14 could be very short and of low capacitance. The inverter input, itself, will present a capacitive load but the capacitance will be generally very small and comparable to other device inputs of the chip. On the other hand, if the transmission gates are spatially interleaved, say with three transmission gates of other multiplexer circuits 10 between I0 and I1, I1 and I2, etc., the length of connection 12 will be increased by much more than a factor of four at least because overlapping of conductors (respectively corresponding to connection 12 in three other four-way multiplexers) must be accommodated. Capacitance may be increased even more at least because of the overlapping of the conductors.

In practice, for a multiplexer comprising four four-way multiplexers accommodating sixteen ordered bits, minimum propagation delay will be accomplished with a layout in which the multiplexer is split into two distributed sections with the respective portions of each section connected by a wire. The best (shortest) delay that can be obtained from such a layout design is 0.62 nsec. to the internal node and 0.82 nsec. for the overall inverting multiplexer. (It should be noted that while a true output may be desired, it is generally better from a signal propagation speed standpoint to buffer the output of any multiplexer with at least one inverter for the simple reason of restoring fast signal transition time, especially in CMOS, and buffering the circuit to accommodate fanout which, if above a fanout of one, further increases the capacitive load on the transmission gate.)

Referring now to FIG. 2, a preferred embodiment of the invention will now be described. Specifically, the layout of FIG. 2 reflects the optimal form of FIG. 1 discussed above in which the multiplexer 20 is split into two distributed, independently selectable sections 20', 20", each buffered by an inverter 24, in accordance with the layout which optimizes performance of the multiplexer of FIG. 1 for the particular application with reference to which the invention is described herein although other articulations may be appropriate to other applications and which will be apparent, in view of this discussion, to those skilled in the art. The layout of the multiplexer is not critical to the practice of the invention which may even be applied to integrated multiplexers, if found advantageous, but the advantages of the invention will be more pronounced as the multiplexer is more widely distributed spatially on the chip or wafer. More importantly to an understanding of the principles of the invention, however, the multiplexer 20 of the invention, as illustrated in FIG. 2 (and FIG. 3) includes a further transistor 22 in each section 20', 20" for connecting the output of the respective section to ground or other reference voltage of appropriate logic value. Further, the (inverted, in this case) outputs of the respective multiplexer sections are combined by a logic gate 26 having an appropriate logical function in view of the overall desired function of the multiplexer (in this case, NAND, for a non-inverting output). It should be understood that the particular arrangement shown assumes that one and only one input is to be selected at any time which must be guaranteed by select logic although other arrangements appropriate to other applications will be evident from this discussion to those skilled in the art.

Transistors 22 function as "pull-down" transistors if no input to that half or section of the multiplexer 20 is to be selected. Such a condition (or any other appropriate condition) can be detected by a gate (e.g. an OR gate 28) appropriately connected to select signals (e.g s1, s2 or their complements S1not, s2not) and the pull down transistor 22 activated. The selection signals will generally be available to appropriately establish the state of the corresponding transmission gates (e.g. I0, I1) prior to the arrival of signals at the inputs thereof, which in the case of the above-described leading zero counting application, would be low or logical "0" corresponding to the voltage to which the node is pulled down.

Pulling the non-selected node or multiplexer section output strongly down (or to the appropriate logic voltage) to a reference voltage forces the input of the buffering inverter 24 to the appropriate level for to reflect non-selection, in this case logical "0", and provides a strong logical "1" voltage at the output thereof and to the input of NAND gate 26 at an earlier point in time while decreasing the transition time, as well.

Thus the NAND gate is strongly activated to propagate any signal from a selected section of the distributed multiplexer when it arrives, thus insulating the internal wiring capacitance of the multiplexer from the inputs. By so doing, in the preferred application, the delay to the internal node is reduced to 0.41 nsec. and the overall delay, even with the additional NAND gate stage, is reduced to 0.58 nsec. for a 25% reduction in propagation delay. Additionally, the increased signal transition speed due to pull-down and preconditioning or activation of the NAND gate 26 provides a 50% reduction in transition time (100% increase in slew rate) reducing the time period during which the output signal may be ambiguous, thus further improving timing margins of the multiplexer which are especially important when the multiplexer is unavoidably in a critical path of the logic circuit.

An alternative embodiment of the invention is shown in FIG. 3. In this embodiment, in contrast to the embodiment of FIG. 2, the transmission gates include only an N-channel field effect transistor 32 (reducing the required chip space by omission of the complementary transistor and the dual rail selection input). Further, the inverters 34 are supplemented by weak half-latches 36 providing feedback of the inverter output to the inverter input to provide a full "up" level at the input of the inverter. Either difference from FIG. 2, or both, can be freely substituted at any point of or throughout the circuit of FIG. 2 and, moreover, other circuits providing a similar or enhanced function (e.g. a strong half-latch or full latch) consistent with the meritorious effects of the invention will be apparent to those skilled in the art from the examples of FIG. 2 and FIG. 3, considered together.

It should be noted that whether or not the select signals are available before the multiplexer inputs, the propagation time to and activation time of the transistors 22 will be very fast and will strongly pull the input of the inverters to the desired signal level and effectively swamp or "kill" any effect on the outputs responsive to the actual inputs to the multiplexer. Thus the output logic gate 26 will be unambiguously enabled at an earlier point in time than previously possible. This meritorious effect is essentially independent of wiring layout and can be exploited to further reduce wiring congestion beyond that dictated by optimum performance in prior multiplexers while retaining the improved performance in propagation time and signal transition speed noted above. This improvement will accrue in any multiplexer which can be articulated into sections, whether of integrated or distributed layout.

In view of the foregoing, it is seen that the invention provides a distributed multiplexer which maintains and improves over performance of integrated multiplexers and can be applied to further improve the performance of the latter. Further, the invention provides a technique for avoiding trade-offs between circuit performance and wiring congestion whereby wiring congestion can be minimized for highest integration density without compromising circuit performance. Additionally, the technique by which the invention may be characterized effectively reduces internal capacitance of a multiplexer or transmission gate array by insulating the internal capacitance from the non-selected inputs and preconditioning or activating output circuitry for fastest response time to selected signals.

While the invention has been described in terms of a single preferred embodiment and variants thereof, those skilled in the art will recognize that the invention can be practiced with modification within the spirit and scope of the appended claims.

Having thus described my invention, what I claim as new and desire to secure by Letters Patent is as follows:

1. A multiplexer circuit having a plurality of sections and an output circuit, at least one of said plurality of said sections of said multiplexer comprising means for detecting non-selection of a section of said multiplexer, means responsive to said means for detecting non-selection for propagating a logic-value signal from said non-selected section to an input of said output circuit; and means for propagating a signal from a selected section of said multiplexer through said output circuit.

2. A multiplexer as recited in claim 1, wherein sections of said multiplexer are spatially distributed.

3. A multiplexer as recited in claim 2, wherein one said means for propagating a logic-value signal to an input of said output circuit is provided in each of said sections of said multiplexer.

4. A multiplexer as recited in claim 1, wherein said output circuit includes a logic gate.

5. A multiplexer as recited in claim 4, wherein said logic gate is a NAND gate.

6. A multiplexer as recited in claim 3, wherein said output circuit includes a logic gate.

7. A multiplexer as recited in claim 6, wherein said logic gate includes a NAND gate.

8. A method of operating a transmission gate array divided into plural selectable sections, said method including the steps of detecting non-selection of a section of said transmission gate array, activating an output circuit in response to said detecting step prior to arrival of signals at inputs of said transmission gate array, and propagating a signal from a selected section of said transmission gate array through said output circuit.

9. A method as recited in claim 8, wherein outputs of respective ones of said plural selectable sections are logically combined.

10. A method as recited in claim 8, wherein said detecting and activating steps are performed in each non-selected section of said multiplexer.

* * * * *